(12) United States Patent
Sun

(10) Patent No.: US 7,755,888 B2
(45) Date of Patent: Jul. 13, 2010

(54) MOUNTING APPARATUS FOR ELECTRONIC DEVICE

(75) Inventor: Zheng-Heng Sun, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 333 days.

(21) Appl. No.: 11/938,303

(22) Filed: Nov. 12, 2007

(65) Prior Publication Data
US 2008/0144259 A1 Jun. 19, 2008

(30) Foreign Application Priority Data
Dec. 19, 2006 (CN) .................. 2006 1 0201328

(51) Int. Cl.
*G06F 1/16* (2006.01)
(52) U.S. Cl. .................. 361/679.38; 361/679.33; 361/679.58; 438/152; 438/928.1
(58) Field of Classification Search .......... 361/679.32, 361/679.4
See application file for complete search history.

(56) References Cited

U.S. PATENT DOCUMENTS

| | | | | | |
|---|---|---|---|---|---|
| 3,926,310 | A | * | 12/1975 | Ackeret | 206/387.12 |
| 4,769,764 | A | * | 9/1988 | Levanon | 361/679.09 |
| 5,400,216 | A | * | 3/1995 | Tsai | 361/679.32 |
| 5,694,290 | A | * | 12/1997 | Chang | 361/679.31 |
| 5,695,351 | A | * | 12/1997 | Kimura et al. | 439/159 |
| 6,123,560 | A | * | 9/2000 | Hara et al. | 439/159 |
| 6,351,394 | B1 | * | 2/2002 | Cunningham | 361/818 |
| 6,452,787 | B1 | * | 9/2002 | Lu et al. | 361/679.38 |
| 6,456,492 | B1 | * | 9/2002 | Wang et al. | 361/679.4 |
| 6,537,090 | B2 | * | 3/2003 | Ozawa | 439/159 |
| 6,652,301 | B2 | * | 11/2003 | Harasawa et al. | 439/159 |
| 6,776,345 | B1 | * | 8/2004 | Liang | 235/486 |
| 7,407,395 | B2 | * | 8/2008 | Deluga et al. | 439/152 |
| 7,522,409 | B2 | * | 4/2009 | Lin et al. | 361/679.01 |
| 2002/0093792 | A1 | * | 7/2002 | Cheng | 361/704 |
| 2002/0160639 | A1 | * | 10/2002 | Ezaki | 439/160 |
| 2003/0103334 | A1 | * | 6/2003 | Yun | 361/724 |
| 2003/0214788 | A1 | * | 11/2003 | Bang-Heng | 361/727 |
| 2004/0022017 | A1 | * | 2/2004 | Chuang | 361/683 |
| 2004/0095731 | A1 | * | 5/2004 | Takada | 361/725 |
| 2006/0073720 | A1 | * | 4/2006 | Lin et al. | 439/152 |
| 2006/0166533 | A1 | * | 7/2006 | Muramatsu et al. | 439/160 |
| 2006/0209507 | A1 | * | 9/2006 | Sidle et al. | 361/685 |

FOREIGN PATENT DOCUMENTS

| | | |
|---|---|---|
| CN | 1115081 | 1/1996 |
| CN | 2501207 | 7/2002 |

* cited by examiner

*Primary Examiner*—Jayprakash N Gandhi
*Assistant Examiner*—Anthony Q Edwards
(74) *Attorney, Agent, or Firm*—Frank R. Niranjan

(57) ABSTRACT

An exemplary mounting apparatus for an electronic device includes a base, a cover covering the base, and an ejection mechanism. The base includes a first receptacle portion for receiving the electronic device, and a second receptacle portion for receiving the ejection mechanism. The ejection mechanism includes a retaining member having a resilient tab slantingly extending therefrom, a button member, and a push member. The push member is slidably attached in the second receptacle portion and includes a push block movably abutting the electronic device, and a protrusion detachably engaging with the resilient tab. The button is moved to disengage the push member from the retaining member so that the push member pushes the electronic device out of the base.

14 Claims, 6 Drawing Sheets

MOUNTING APPARATUS FOR ELECTRONIC DEVICE

BACKGROUND

1. Field of the Invention

The present invention relates to mounting apparatuses, and particularly to a mounting apparatus readily allowing installation or removal of an electronic device thereto or therefrom.

2. Description of Related Art

Traditionally, electronic devices, such as card readers, are connected with a host machine from the outside via an inseparable cable line which transmits data. One end of the cable line is connected with the card reader, and the other end is connected with a plug for use in a Universal Serial Bus (USB). When the card reader is needed, the user has to plug the USB plug into the USB connection port of a desktop computer or notebook. By this method, not only is the action of connecting the lines needed, but also space that might be put to better use around the computer is used.

At present, the capacity of memory cards regularly increases, while at the same time, prices regularly decrease. Therefore, host machines with built-in card readers have become available in the market. However, built-in card readers are not portable. If a user works with more than one computer at more than one location then each computer would require a card reader, which would be expensive.

Some conventional host machines have separable card readers installed therein. However, the mechanism of the host machines to remove the installed card readers is usually complicated and difficult to manipulate. Especially since the mechanism is more likely to become unbalanced during removal of the card readers, hence the card readers are somehow difficult to be smoothly removed.

What is desired, therefore, is a mounting apparatus which readily allows convenient installation or removal of an electronic device thereto or therefrom for portability.

SUMMARY

An exemplary mounting apparatus for an electronic device includes a base, a cover covering the base, and an ejection mechanism. The base includes a first receptacle portion for receiving the electronic device, and a second receptacle portion for receiving the ejection mechanism. The ejection mechanism includes a retaining member having a resilient tab slantingly extending therefrom, a button member, and a push member. The push member is slidably attached in the second receptacle portion and includes a push block movably abutting the electronic device, and a protrusion detachably engaging with the resilient tab. The button is moved to disengage the push member from the retaining member so that the push member pushes the electronic device out of the base.

Other advantages and novel features will become more apparent from the following detailed description when taken in conjunction with the accompanying drawings, in which:

DETAILED DESCRIPTION OF THE EMBODIMENTS

Figure 1:
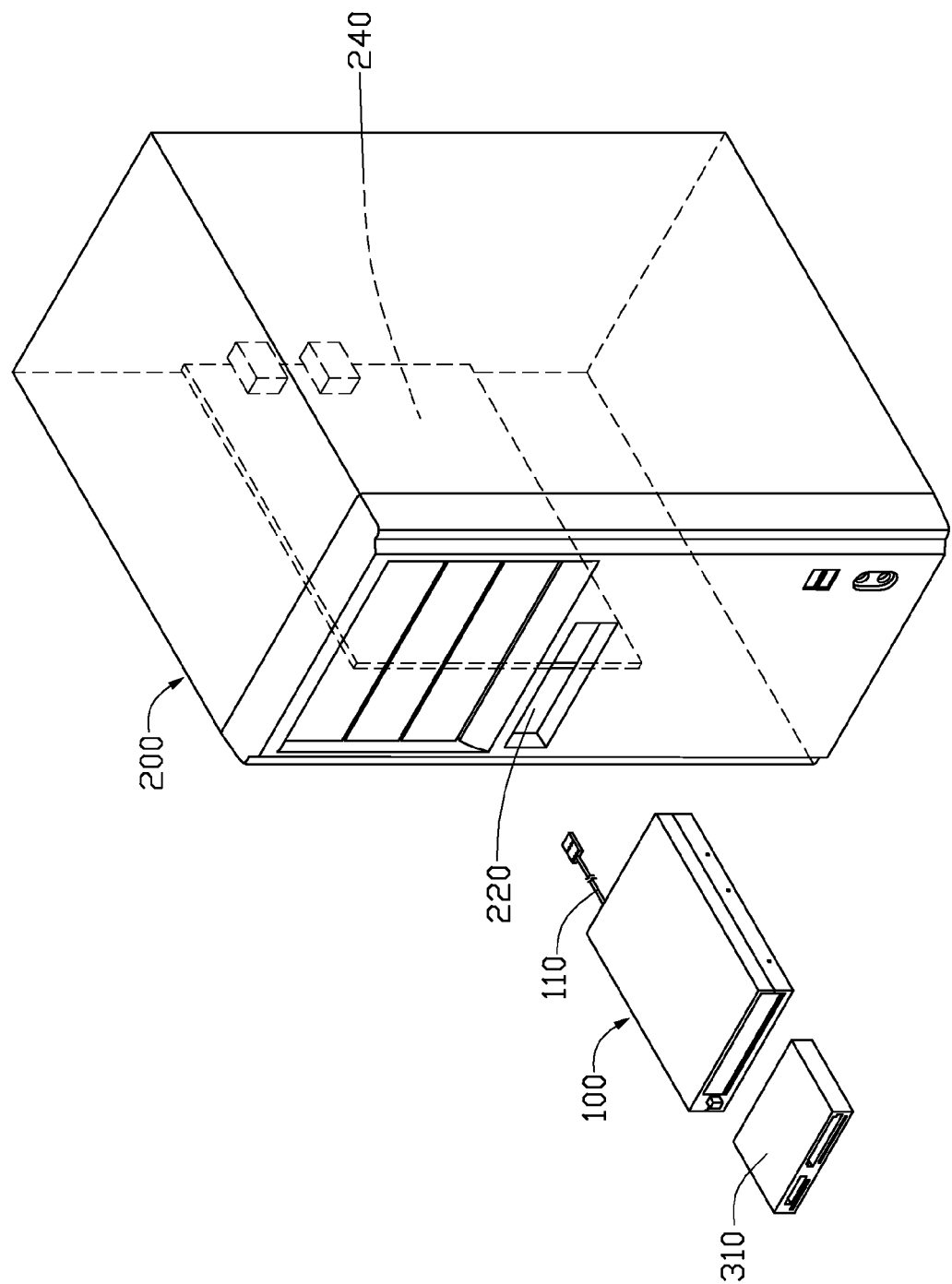
FIG. 1 is an exploded, isometric view of a mounting apparatus of a first embodiment of the present invention, with an electronic device, and a computer enclosure.

Referring to FIG. 1, a mounting apparatus 100 in accordance with a first embodiment is for mounting an electronic device 310, such as a card reader or a USB hub. The electronic device 310 can remain outside of an enclosure 200 of a computer and electronically communicate with a circuit board 240 of the computer via a USB cable 110. The electronic device 310 can also be retained in a receiving space 220 of the enclosure 200 to electronically communicate with the circuit board 240.

Figure 2:
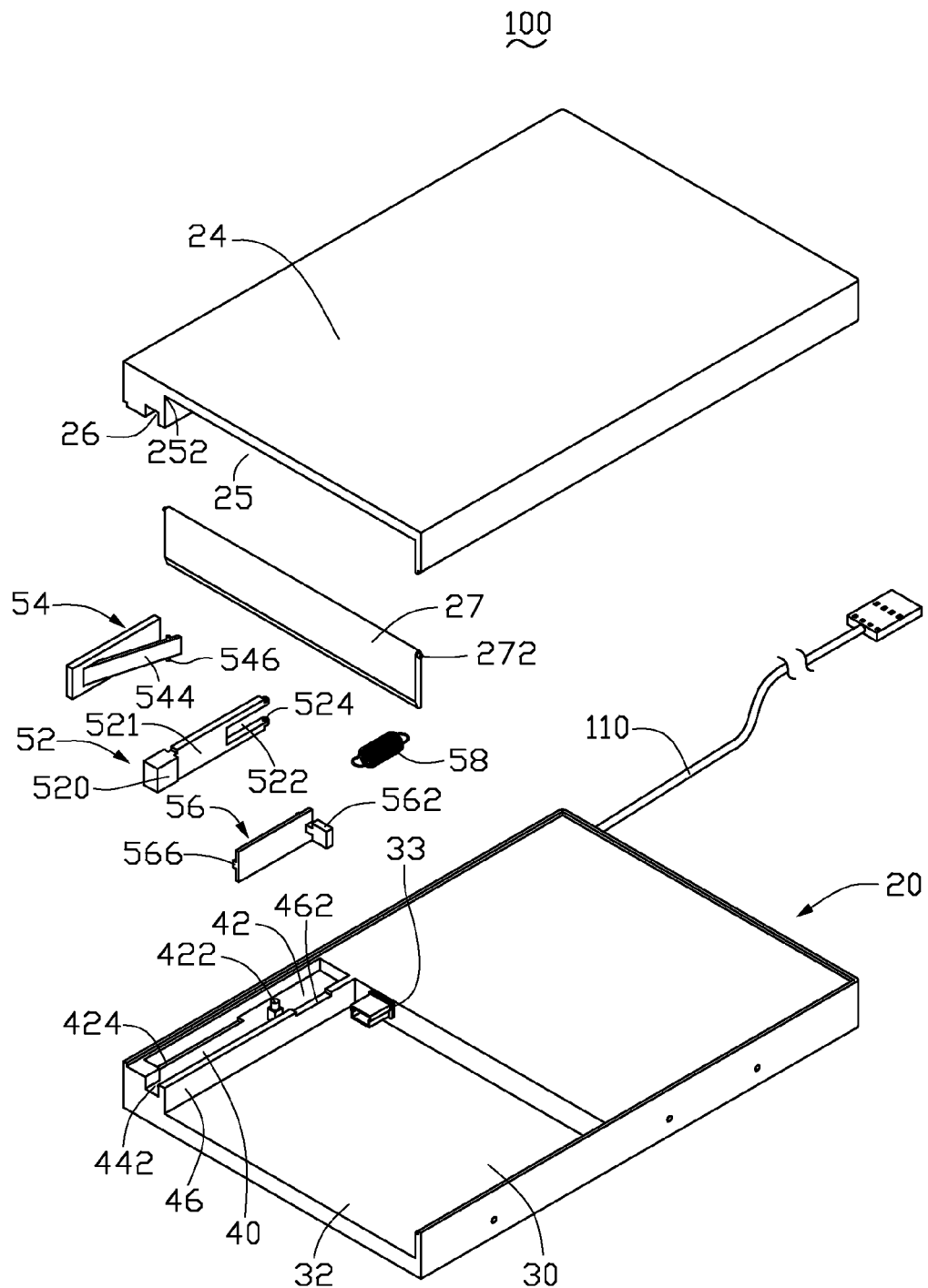
FIGS. 2 and 3 are exploded, isometric views of the mounting apparatus of FIG. 1, but viewed in opposite aspects, the mounting apparatus including a base, a cover, and an ejection mechanism.
Figure 3:
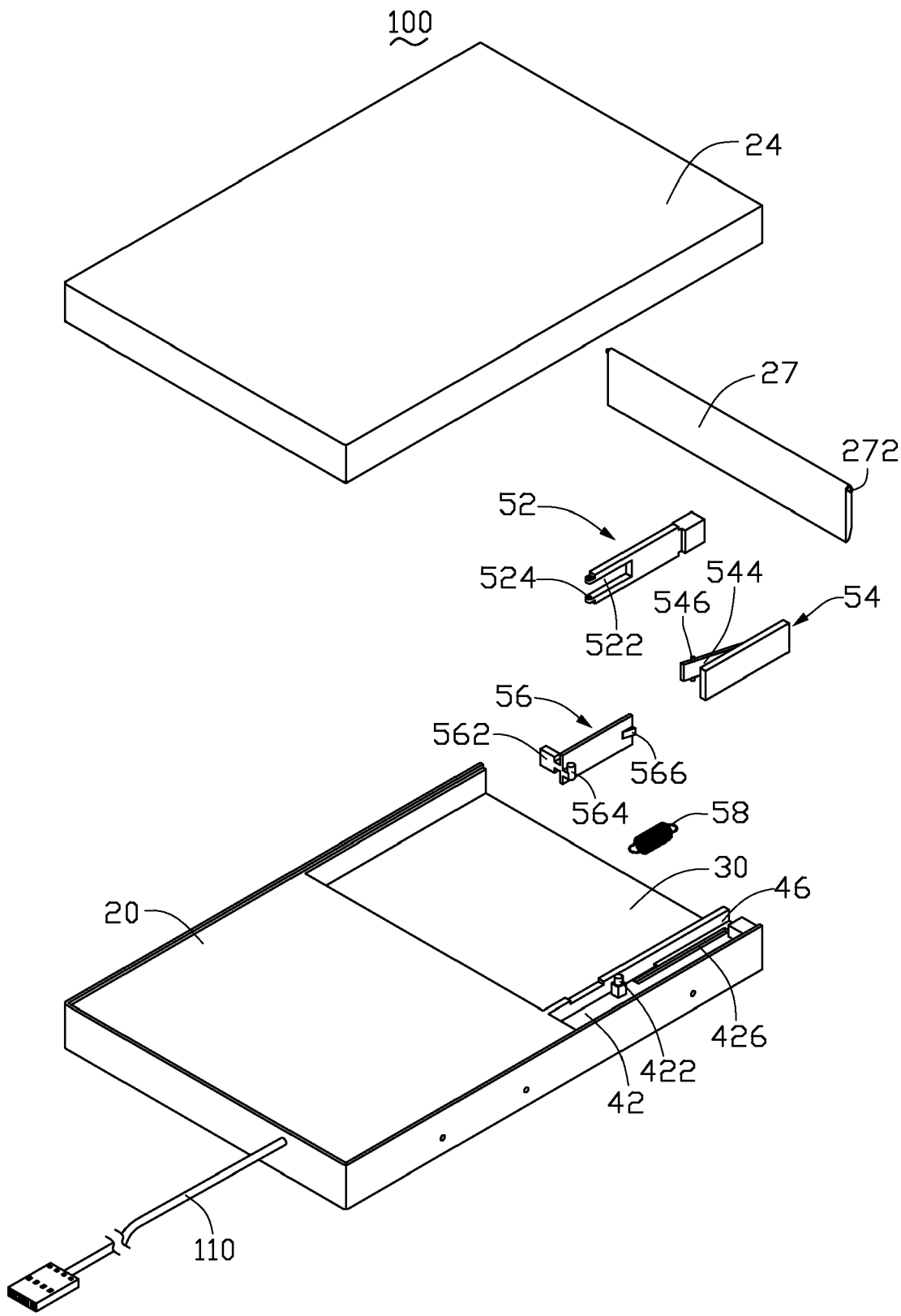

Referring to FIGS. 2 and 3, the mounting apparatus 100 includes a base 20, a cover 24, and an ejection mechanism.

The base 20 includes a first receptacle portion 30 for receiving the electronic device 310, and a second receptacle portion 40 for receiving the ejection mechanism. The first receptacle portion 30 is beside the second receptacle portion 40. The first receptacle portion 30 and the second receptacle portion 40 have a separating wall 46 disposed therebetween. A cutout 462 is defined in the separating wall 46. A channel 426 and a slit 424 are defined in a bottom wall 42 of the second receptacle 40, near to and away from the separating wall 46 respectively. A first opening 32 is defined in the front of the first receptacle portion 30. A hole 33 is defined in the rear wall of the first receptacle portion 30, for a plug of the USB cable 110 received therein. A second opening 442 is defined in the front wall of the second receptacle portion 40. A post 422 extends upwardly from the bottom wall 42 of the second receptacle portion 40.

The cover 24 covers the base 20 and includes a first opening 25 corresponding to the first opening 32 of the first receptacle portion 30 of the base 20, and a second opening 26 corresponding to the second opening 442 of the second receptacle portion 40 of the base 20. The first openings 25, 32 cooperatively define a first entrance. The second openings 26, 442 cooperatively define a second entrance. A pair of pivoting holes 252 is defined in upper portions of opposite sides of the first opening 25 of the cover 24 respectively, for pivotably engaging with a pair of shafts 272 of a door 27 which covers the first entrance.

The ejection mechanism includes a button member 52, a retaining member 54, a push member 56, and a resilient member 58. The button member 52 includes an elongate actuating portion 521, and an enlarged operation portion 520 formed at a front end of the actuating portion 521. A cutout 522 is defined in a rear portion of the actuating portion 521 of the button member 52. A pair of pivoting holes 524 is defined at opposite sides of the cutout 522 near distal ends of the actuating portion 521 of the button member 52, respectively. The retaining member 54 includes a cantilevered resilient tab 544 slantingly extending from a front portion thereof. A pair of shafts 546 respectively extends from opposite sides of the resilient tab 544 near a free rear end thereof, for engaging in the pivoting holes 524 of the button member 52. Referring also to FIG. 3, a push block 562 and a post 564 extend perpendicularly and opposite from a rear end of the push member 56. The push block 562 and the post 564 each have a narrow neck portion connecting to the push member 56. A wedged protrusion 566 extends from a front end of the push member 56, at a same side as the post 564.

Figure 4:
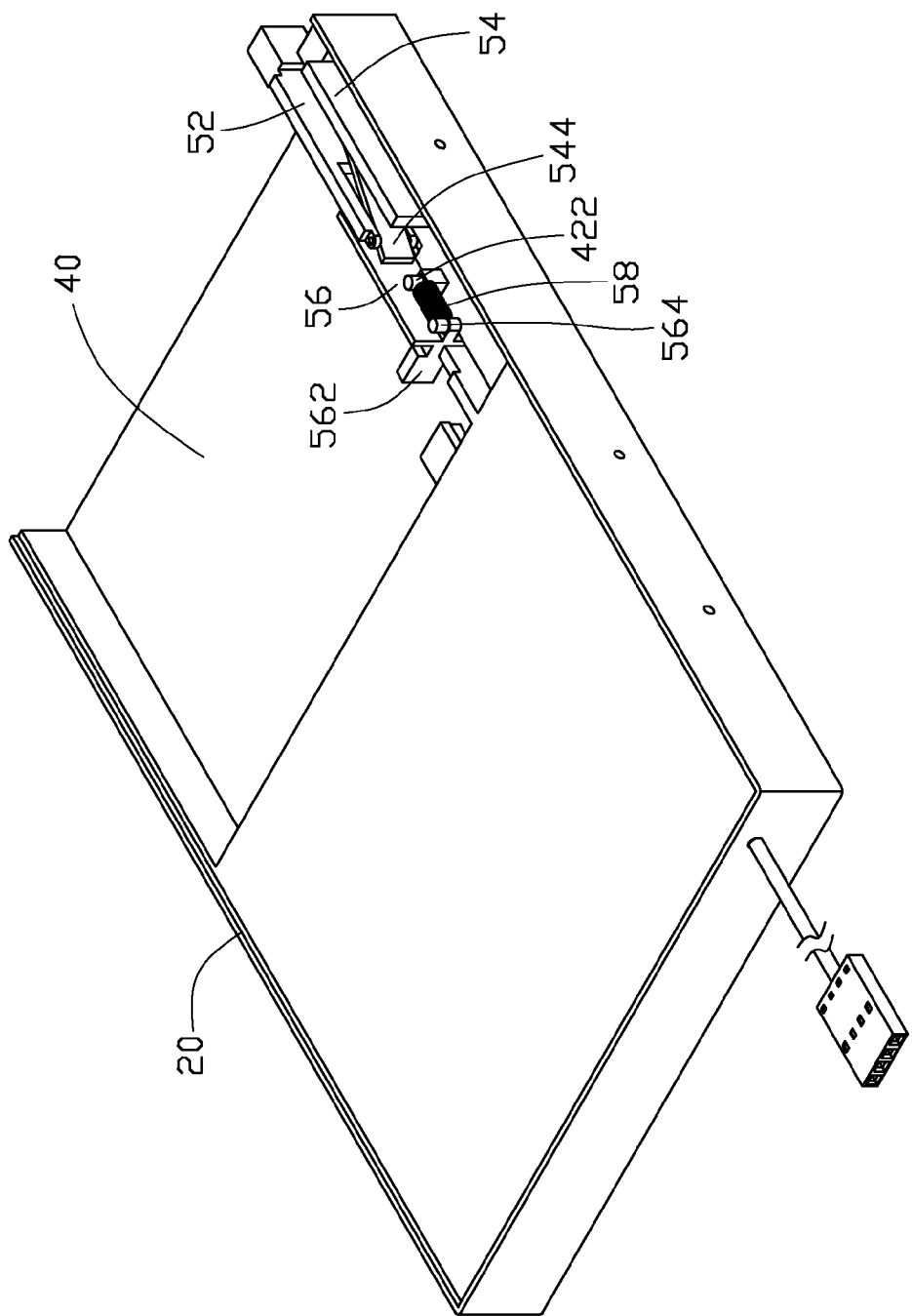
FIGS. 4 and 5 are assembled views of the mounting apparatus of FIG. 2 and FIG. 3 respectively, with the cover removed.
Figure 5:
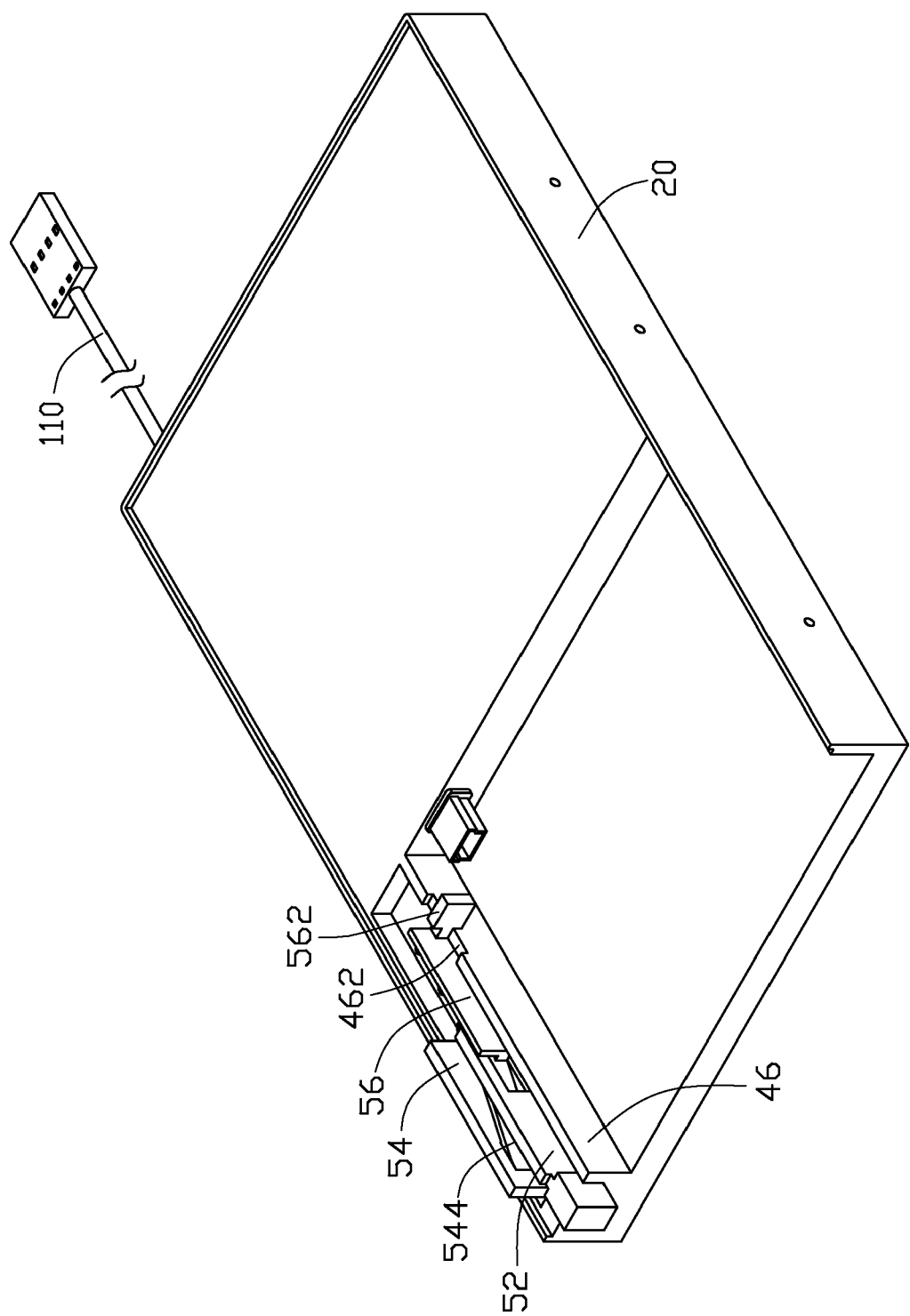

Referring to FIGS. 4 and 5, in assembly, the ejection mechanism is attached to the base 20. The bottom of the retaining member 54 is received in the slit 424 of the bottom wall 42 of the second receptacle portion 40. The button member 52 is inserted into the second receptacle portion 40 from the second opening 442, with the operating portion 520 staying outside. The resilient tab 544 of the retaining member 54 is received in the cutout 522 of the button member 52, with the shafts 546 thereof engaging in the pivoting holes 524 of the actuating portion 521 of the button member 52. The push member 56 is slidably attached to the bottom wall 42 of the second receptacle portion 40, with the bottom thereof slidably received in the channel 426 of the second receptacle portion 40. The neck portion of the push block 562 of the push member 56 is slidably received in the cutout 462 of the separating wall 46. Two ends of the resilient member 58 respectively engage with the post 422 of the second receptacle portion 40 and the post 564 of the push member 56. The cover 24 together with the door 27 covers the base 20, with the door 27 shielding the first entrance.

When inserting the electronic device 310 into the first receptacle portion 30 of the base 20 via the first entrance, the rear end of the electronic device 310 pushes the door 27 of the cover 24 to pivot so that the electronic device 310 is allowed in. With further movement of the electronic device 310, the rear end of the electronic device 310 contacts and gradually pushes the push block 562 of the push member 56 inward and the resilient member 58 is elongated. When the distal end of the resilient tab 544 of the retaining member 54 contacts the wedged protrusion 566 of the push member 56, the movement is stopped and the electronic device 310 is positioned. In this position, a connector of a rear portion of the electronic device 310 engages with the plug of the USB cable 110.

When removing the electronic device 310, the operating portion 520 of the button member 52 is pushed inward. A front edge of the cutout 522 of the button member 52 urges the resilient tab 544 of the retaining member 54 away from the push member 56. After the distal end of the resilient tab 544 of retaining member 54 disengages from the wedged protrusion 566 of the push member 56, the resilient member 58 rebounds. Consequently, the push block 562 of the push member 56 pushes the electronic device 310 out a certain distance for facilitating removal thereof.

Figure 6:
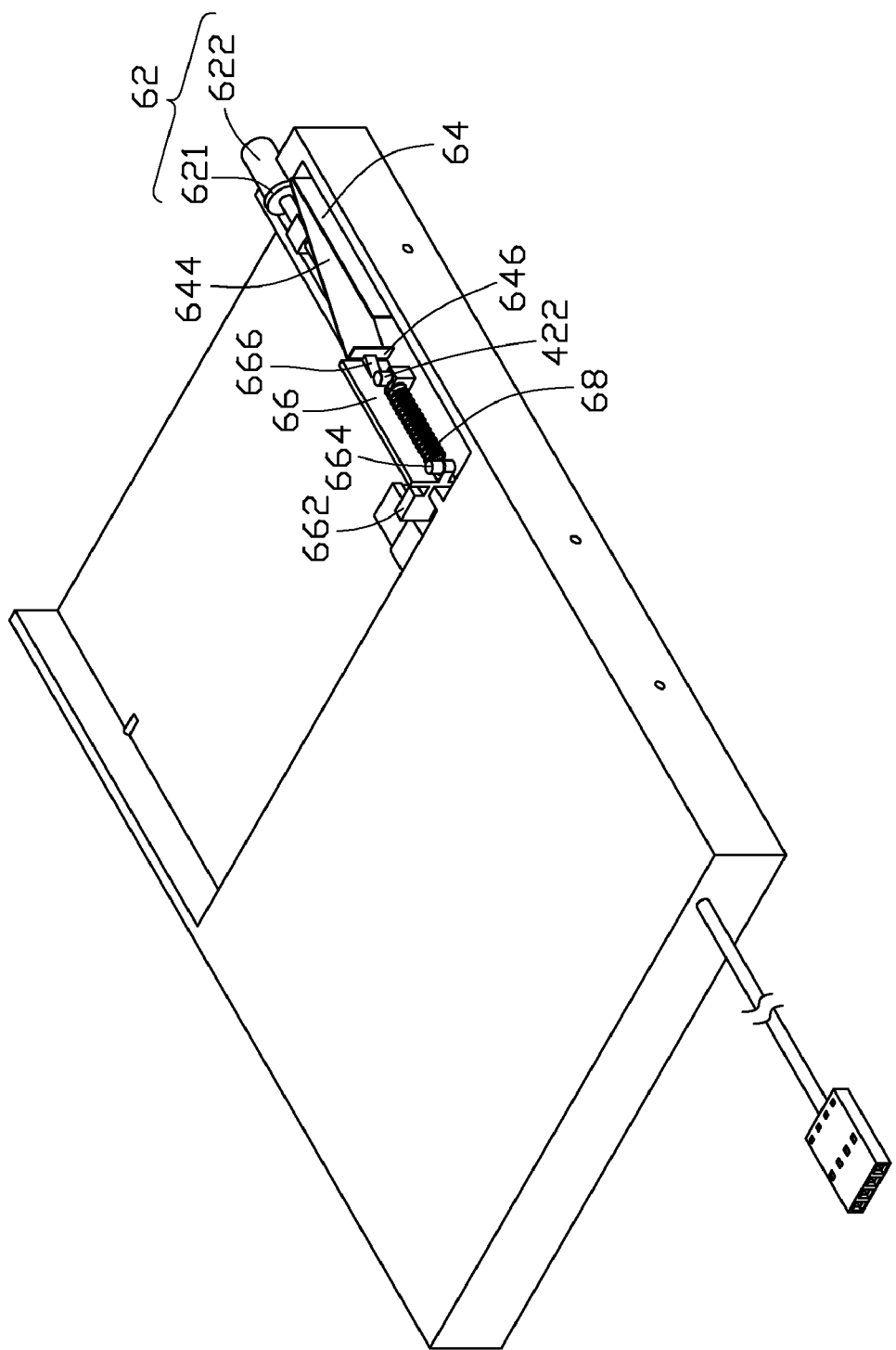
FIG. 6 is an assembled view of a mounting apparatus in accordance with a second embodiment of the present invention.

Referring to FIG. 6, the ejection mechanism in accordance with a second embodiment includes a button member 62, a retaining member 64, a push member 66, and a resilient member 68. The button member 62 is a cylindrical, and has a flange 621 with a larger diameter than that of an operating portion 622 disposed at an outside of the button member 62. The retaining member 64 includes a resilient tab 644 slantingly extending from a front portion thereof. A hem 646 extends from the distal end of the resilient tab 644 toward the retaining member 64. The push member 66 is configured the same as the push member 56 of the first embodiment and also includes a pushing block and a post 664 formed at the rear end thereof, and a wedged protrusion 666 formed at the front end thereof.

The push member 66, the retaining member 64, the resilient member 68, and the button member 62 are attached to the second receptacle portion 40 of the base 20 in the same way as the ejection mechanism of the first embodiment, wherein one end of the button member 62 movably contacts the resilient tab 644 and the hem 646 of the retaining member 64 movably contacts the wedged protrusion 666 of the push member 66. When the electronic device 310 is inserted into the first receptacle portion 30 of the base 20 via the first entrance, the rear end of the electronic device 310 gradually urges the push block 662 of push member 66 inward and the resilient member 58 is elongated. When the hem 646 of the resilient tab 644 of the retaining member 64 contacts the wedged protrusion 666 of the push member 66, the movement is stopped and the electronic device 310 is positioned. Pushing the button member 62 inward, the end of the button member 62 urges the resilient tab 644 of the retaining member 64 to move away from the push member 66. After the hem 646 of the retaining member 64 disengages from the wedged protrusion 666 of the push member 66, the resilient member 68 rebounds. Consequently, the push block 662 of the push member 66 pushes the electronic device 310 out a certain distance for facilitating removal thereof.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A mounting apparatus for an electronic device comprising:
   a base comprising a first receptacle portion for receiving the electronic device, and a second receptacle portion beside the first receptacle portion; and
   an ejection mechanism received in the second receptacle portion and comprising a retaining member having a resilient tab slantingly extending therefrom, a button member, and a push member slidably mounted in the second receptacle portion, the push member comprising a push block movably abutting the electronic device, and a protrusion detachably engaging with the resilient tab, wherein when the electronic device is positioned in the first receptacle portion of the base, the protrusion of the push member engages with the resilient tab, the push member is locked, and the push block abuts the electronic device; when the button member is moved, the resilient tab is driven by the button member to disengage from the protrusion so that the push block pushes the electronic device out of the base.

2. The mounting apparatus as claimed in claim 1, wherein the first receptacle portion and the second receptacle portion cooperatively comprise a separating wall disposed therebetween, a cutout is defined in the separating wall, the push block comprises a narrow neck portion connecting the push member and slidably received in the cutout.

3. The mounting apparatus as claimed in claim 2, wherein the second receptacle portion comprises a bottom wall, a channel and a slit are defined in the bottom wall, respectively near and away from the separating wall, the push member is slidably received in the channel, the retaining member is received in the slit.

4. The mounting apparatus as claimed in claim 1, wherein the push block is formed at an inside end of the push member, the protrusion is formed at an outside of the push member.

5. The mounting apparatus as claimed in claim 4, further comprising a resilient member, wherein the push member further comprises a first post formed at the inside end thereof opposite to the push block, the second receptacle portion comprises a second post, two opposite ends of the resilient member are attached to the first post and the second post respectively.

6. The mounting apparatus as claimed in claim 4, wherein the resilient tab of the retaining member comprises a pair of shafts extending from opposite sides thereof respectively, the button member comprises a cutout defined therein with a pair of pivoting holes defined at opposite sides thereof to engage with the shafts of the retaining member respectively, the protrusion of the push member is wedge shaped, an distal end of the resilient tab movably contacts the protrusion.

7. The mounting apparatus as claimed in claim 4, wherein the resilient tab of the retaining member comprises a hem extending from a distal thereof and toward the retaining member, the protrusion of the push member is wedged, the hem of the resilient tab movable contacts the protrusion, an inside end of the button member abuts the resilient tab.

8. A mounting apparatus assembly comprising:
a base comprising a first receptacle portion, and a second receptacle portion beside the first receptacle portion;
an electronic device movably received in the first receptacle; and
an ejection mechanism received in the second receptacle portion and comprising a retaining member having a resilient tab slantingly extending therefrom, a button member movably deforming the resilient tab, a push member slidably contacting the electronic member, and a resilient member slidably attached the push member in the second receptacle portion;
wherein with the electronic device moved into the first receptacle, the push member is pushed inward to deform the resilient member until the push member is positioned with the resilient tab of the retaining member; when the button member is pushed inward, the resilient tab of the retaining member is deformed to disengage from the push member, the resilient member rebounds to drive the push member and the electronic device out.

9. The mounting apparatus assembly as claimed in claim 8, further comprising a cover covering the base, wherein a first opening and a second opening are defined in a front of the base, the cover comprises a first opening with a door pivotally attached therein, and a second opening defined therein, respectively corresponding to the first and second openings of the base, the first openings cooperatively define a first entrance for the electronic device entering therethrough, the second openings cooperatively defines a second entrance for the button member of the eject mechanism entering therethrough.

10. The mounting apparatus assembly as claimed in claim 8, wherein the first receptacle portion and the second receptacle portion cooperatively comprises a separating wall disposed therebetween, a cutout is defined in the separating wall, the push member comprises a push block contacting the electronic device, the push block comprises a neck portion with a small size connecting with the push member slidably received in the cutout.

11. The mounting apparatus assembly as claimed in claim 8, wherein the push block is formed at an inside end of the push member, a protrusion is formed at an outside of the push member to engage with the resilient tab of the retaining member.

12. The mounting apparatus assembly as claimed in claim 8, wherein the push member further comprises a first post formed at the inside end thereof and opposite to the push block, the second receptacle portion comprises a second post extending from a bottom wall thereof, two opposite ends of the resilient member are attached to the first post and the second post respectively.

13. The housing as claimed in claim 8, wherein the resilient tab of the retaining member comprises a pair of shafts extending from opposite sides thereof, the button member comprises a cutout defined therein with a pair of pivoting holes defined in two opposite sides thereof to engage with the shafts of the retaining member, the protrusion of the push member is wedged, a distal of the resilient tab movable contacts the protrusion.

14. The housing as claimed in claim 8, wherein the resilient tab of the retaining member comprises a hem extending from a distal thereof toward the retaining member, the protrusion of the push member is wedged, the hem of the resilient tab movable contacts the protrusion, an inside end of the button member abuts the resilient tab.

* * * * *